United States Patent [19]

Hattori et al.

[11] Patent Number: 5,047,646

[45] Date of Patent: Sep. 10, 1991

[54] METHOD OF CORRECTING ASTIGMATISM OF VARIABLE SHAPED BEAM

[75] Inventors: Kiyoshi Hattori, Tokyo; Shuichi Tamamushi; Eiji Nishimura, both of Kawasaki; Naotaka Ikeda, Fujisawa; Hirotsugu Wada, Tokyo, all of Japan

[73] Assignee: Kabushiki Kaisha Toshiba, Kawasaki, Japan

[21] Appl. No.: 570,024

[22] Filed: Aug. 20, 1990

[30] Foreign Application Priority Data

Sep. 21, 1989 [JP] Japan .................................. 1-243313

[51] Int. Cl.$^5$ ...................... H01J 37/30; H01J 37/304
[52] U.S. Cl. .......................... 250/396 R; 250/396 ML; 250/492.2
[58] Field of Search ............ 250/310, 396 R, 396 ML, 250/397, 492.2

[56] References Cited

U.S. PATENT DOCUMENTS

| | | | |
|---|---|---|---|
| 4,090,077 | 5/1978 | Anger | 250/396 R |
| 4,321,468 | 3/1982 | Kimura | 250/310 |
| 4,362,942 | 12/1982 | Yasuda | 250/398 |
| 4,392,054 | 7/1983 | Sato et al. | 250/396 R |
| 4,763,004 | 8/1988 | Yasuda et al. | 250/396 ML |
| 4,825,033 | 4/1989 | Beasley | 219/121.25 |
| 4,914,304 | 4/1990 | Koyama | 250/492.2 |

OTHER PUBLICATIONS

Proc. Microcircuit Engineering 81, p. 139, "Auto Calibration of VL-R2 Deflection System"; H. Wada et al; 1981.
J. Vac. Sci. and Technol. B, vol. 5 (1), p. 70, "A High Dose and High Accuracy Variable Shaped Electron . . . "; R. Yoshikawa et al; 1987.
J. Vac. Sci. and Technol. B, vol. 3, No. 1, p. 181; "Automatic Column Control for High Speed Beam Delineator", M. Goto et al; 1985.
Proc. Microcircuit Engineering, p. 235, "A Marker Registration and Automatic Focussing Strategy for High Resolution E-Beam Systems": A. P. C. van Schendel; 1985.
Hewlett-Packard Journal, p. 27, May 1981, "Calibration of the HP Electron Beam Lithography System"; Faith L. Bugely et al; 1981.

Primary Examiner—Bruce C. Anderson
Attorney, Agent, or Firm—Oblon, Spivak, McClelland, Maier & Neustadt

[57] ABSTRACT

A method of correcting astigmatism of a variable shaped beam uses a charged beam lithographic apparatus having a deflector for generating the shaped beam, a focus correction coil for adjusting a focus of the shaped beam, and astigmatism correction coils for correcting the astigmatism of the shaped beam. The method comprises the steps of adjusting the focus of the shaped beam by using the focus correction coil, and correcting the astigmatism of the shaped beam by using the astigmatism correction coils, the step of correcting the astigmatism of the shaped beam including the substeps of measuring first edge resolutions of the shaped beam in an arbitrary first direction and a second direction perpendicular to the first direction, and correcting first astigmatism in the first and second directions on the basis of the first edge resolutions, and measuring second edge resolutions in a third direction oblique to the first direction and a fourth direction perpendicular to the third direction, and correcting second astigmatism in the third and fourth directions on the basis of the second edge resolutions.

19 Claims, 14 Drawing Sheets

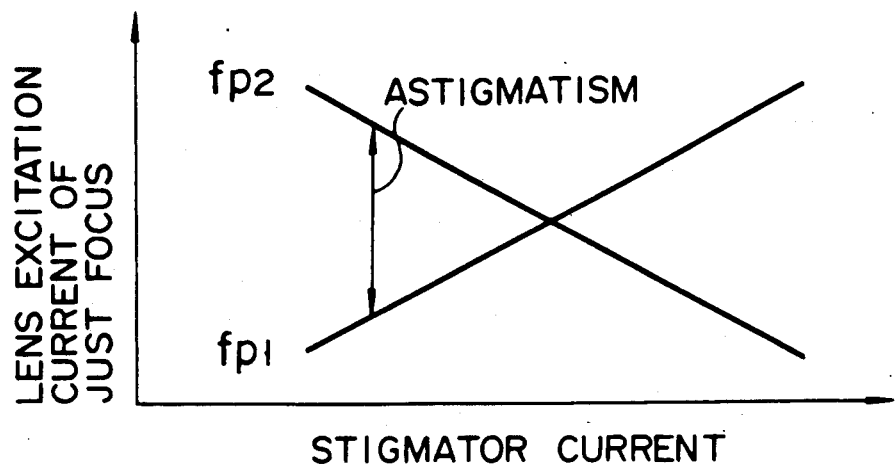
F I G. 7
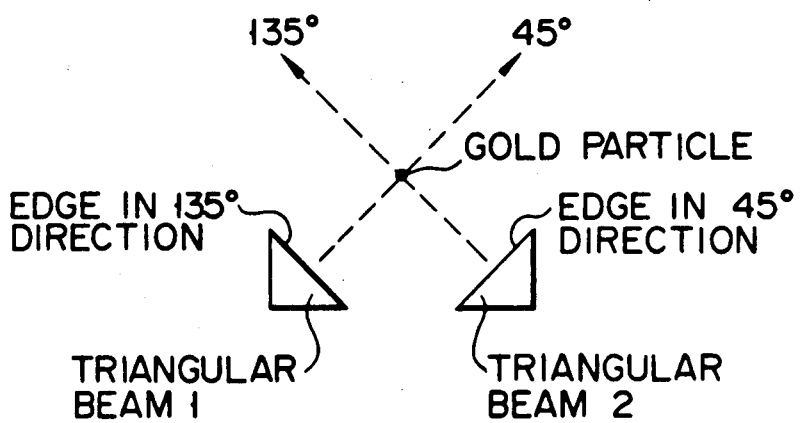
F I G. 8

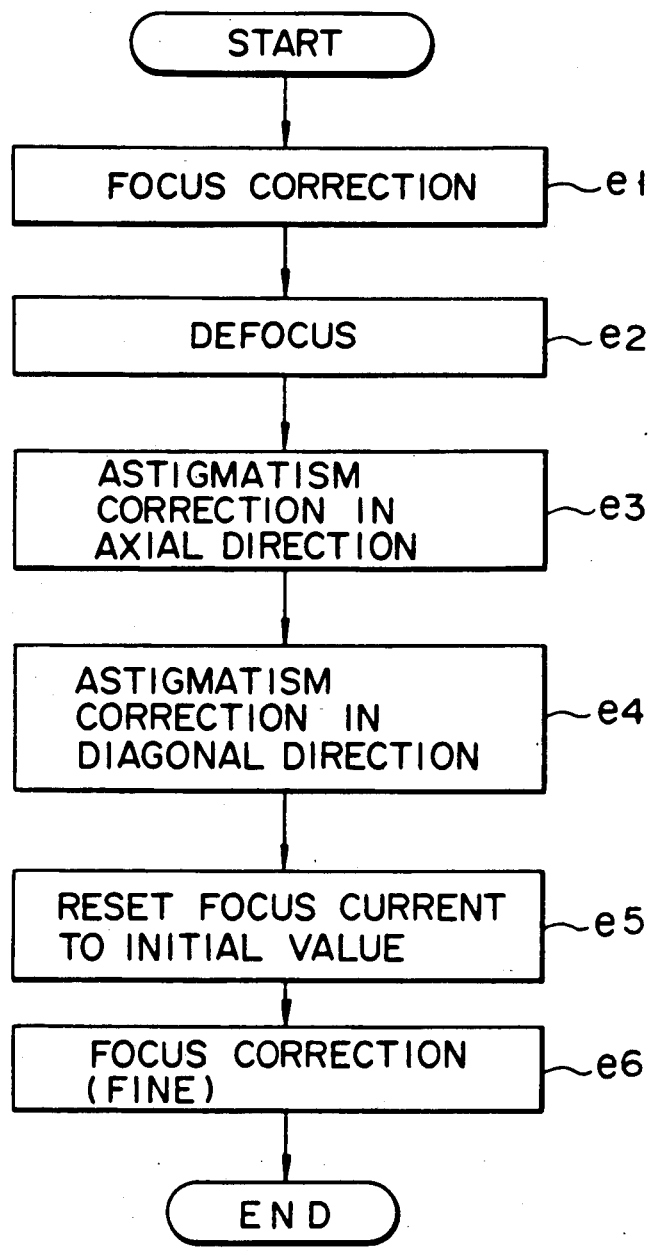
F I G. 16

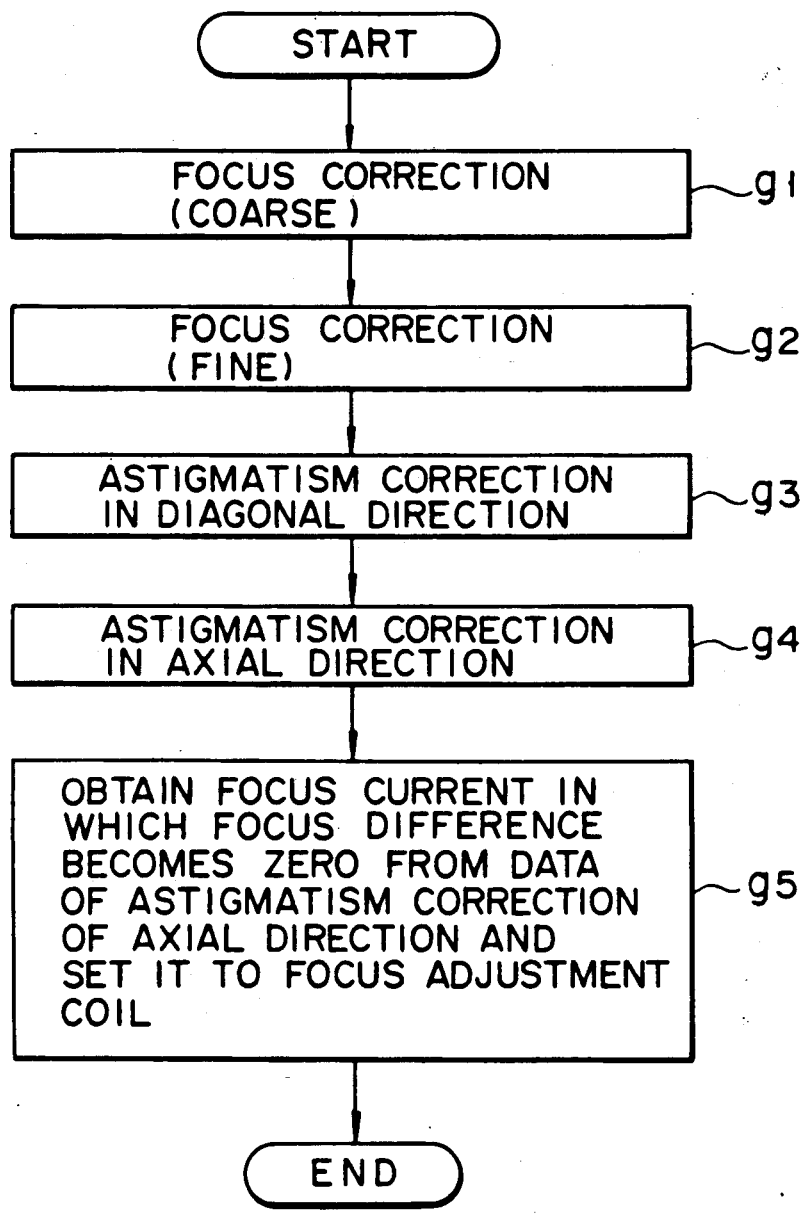
F I G. 19

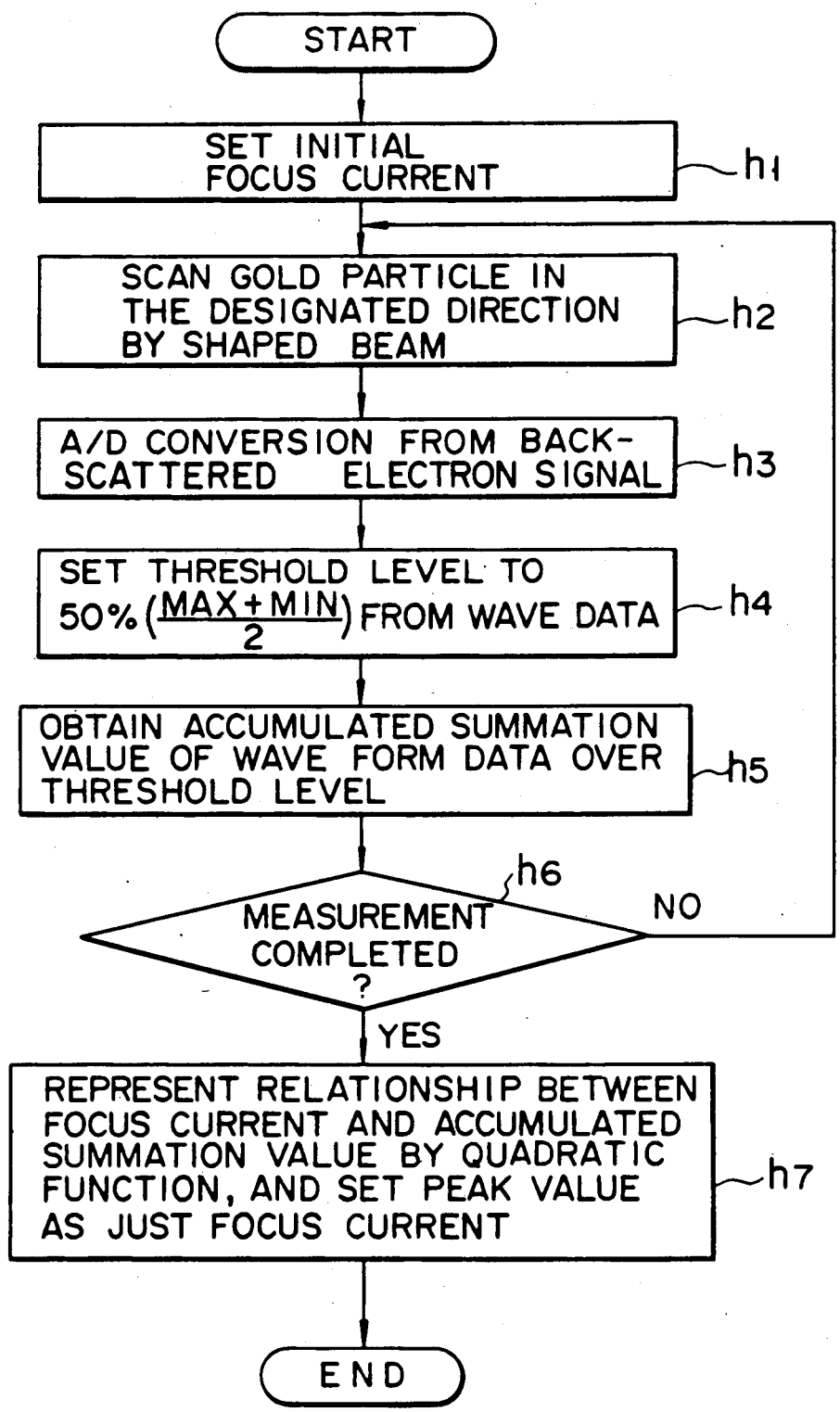
F I G. 20

METHOD OF CORRECTING ASTIGMATISM OF VARIABLE SHAPED BEAM

BACKGROUND OF THE INVENTION

1. Field of the Invention

The present invention relates to a method of scanning a charged beam to draw a micropattern of an LSI or the like on a target and, more particularly, to a method of automatically correcting astigmatism of a variable shaped beam.

2. Description of the Related Art

An electron beam lithographic apparatus using a variable shaped electron beam is known as a conventional apparatus for drawing a desired pattern on a target such as a semiconductor wafer. In this electron beam lithographic apparatus, a beam emitted from an electron gun and passing through an aperture is focused by various electron lenses, and the focused beam is radiated onto the target. Since any electron lens has astigmatism, the shaped beam also has astigmatism. Astigmatism in the beam causes degradation of drawing precision, and this astigmatism must be eliminated. For this purpose, the following method is employed. A mark on a target is scanned with a shaped beam to obtain a back-scattered or secondary electron signal, and the resolution of the shaped beam is measured by using this signal. The measured resolution is then utilized to correct astigmatism by astigmatism correction coils arranged near an objective lens.

This conventional method, however, poses the following problem. A conventional method of correcting astigmatism of a shaped beam in an electronic beam lithographic apparatus is performed in a direction of 0° parallel to a given side of a rectangular beam and a direction of 90° perpendicular to the given side. Scanning in only these directions makes it very difficult to measure a resolution at a corner portion of the rectangular beam. For example, no practical method for astigmatism correction in directions of, e.g., 45° and 135° has yet been proposed to date. It is very difficult to obtain a high-precision shaped pattern. Even in astigmatism correction in directions of 0° and 90°, when astigmatism and a focus are corrected by measuring a beam resolution from a back-scattered or secondary electron signal obtained upon scanning of a mark on a target with a shaped beam, resolution of the beam cannot be precisely measured due to the tendency to get influences such as noise in measurement of the resolution of the beam, and sufficient correction precision cannot be obtained. When complicated processing of a beam wave is performed to improve precision, a processing time is undesirably prolonged.

In the conventional charged beam lithographic method using a variable shaped beam, astigmatism is corrected on the basis of the beam resolution obtained by scanning the mark with the shaped beam. According to this method, however, the beam resolution cannot be precisely measured due to the tendency to get influences such as noise in measurement of the resolution of the beam, and correction precision is undesirably degraded. When an improvement of correction precision is attempted, the processing speed is, in turn, decreased. It is difficult to easily correct astigmatism in a direction inclined from each side of the shaped beam, e.g., directions of 45° and 135°.

SUMMARY OF THE INVENTION

It is an object of the present invention to provide a method of correcting astigmatism of a charged beam, wherein astigmatism in a direction perpendicular to each side of a shaped beam and in an oblique direction with respect thereto can be easily corrected, a processing speed is high, and correction is not easily affected by noise.

The gist of the present invention lies in generation of a triangle beam having an oblique side in a direction of 45° or 135° in addition to generation of a rectangular beam having a side in a direction of, e.g., 0° or 90°. The rectangular beam is scanned on a target in directions of 0° and 90°, and the triangle beam is scanned on the target in directions of 45° and 135° to obtain beam edge resolutions in the directions of 0°, 90°, 45°, and 135°, thereby correcting astigmatism of the shaped beam.

The method of correcting astigmatism of a variable shaped beam uses a charged beam lithographic apparatus. The charged beam lithographic apparatus has first and second shaping aperture, a deflector for generating a shaped beam by an optical superposition, a focus correction coil for adjusting a focus of the shaped beam, and astigmatism correction coils for correcting the astigmatism of the shaped beam. The method comprises the steps of:

adjusting the focus of the shaped beam by using the focus correction coil; and correcting astigmatism of the shaped beam by using the astigmatism correction coils, the step of correcting astigmatism of the shaped beam including the substeps of measuring first edge resolutions of the shaped beam in an arbitrary first direction and a second direction perpendicular to the first direction, and correcting first astigmatism in the first and second directions on the basis of the first edge resolutions, and measuring second edge resolutions in a third direction oblique to the first direction and a fourth direction perpendicular to the third direction, and correcting second astigmatism in the third and fourth directions.

More specifically, in a variable shaped electron beam lithographic apparatus, for example, triangle beams having oblique sides in directions of 45° and 135° are generated in addition to the rectangular beam. A gold particle located on a target is scanned with the triangle beams in the directions of 45° and 135°. Beam edge resolutions in all the directions of 0°, 90°, 45°, and 135° are measured. In practice, an intensity distribution signal of the shaped beam is A/D-converted. A difference signal (differential) between the obtained wave data and data obtained by delaying the wave data is calculated. Difference signal data of a predetermined threshold level or more are accumulatively summed. The summed difference signal is used in place of the beam resolution. During focus adjustment, the focus is changed to accumulatively sum the difference signals, and a point corresponding to a maximum accumulated summation value is given as a just focus value. By using this focusing method, a focus difference in the directions of 45° and 135° is calculated while the astigmatism corrected value is changed. Then a corrected value of astigmatism corresponding to a zero focus difference is obtained. Corrected values of astigmatism in the directions of 0° and 90° are obtained in the same manner as described above.

According to the present invention, edge resolutions of triangle beams having obique sides to a side of a shaped beam are measured. For example, when a shaped beam has sides in the directions of 0° and 90°, a triangle beam having an oblique side in the direction of 45° or 135° is used. Astigmatism correction of the triangle beam is performed by using an astigmatism correction coil oblique in the direction of 45° or 135°, and therefore astigmatism in the directions of 45° and 135° in addition to that in the direction of 0° and 90° can be accurately corrected. In addition, according to the present invention, astigmatism correction does not greatly depend on wave noise, and astigmatism can be corrected at high speed. A complicated processing circuit or software for calculating the beam resolution is not required, and data corresponding to the beam resolution can be obtained by simple calculations. Therefore, correction can be accurately performed within a short period of time.

The step of adjusting the focus includes the substep of scanning a mark on the target with the shaped beam, obtaining just focus values corresponding to minimum edge resolution values in two orthogonal directions upon changes in current value of the focus correction coil, and setting the just focus values in the focus correction coil.

The step of correcting astigmatism includes the substeps of calculating a focus difference between focus values in the directions of 0° and 90° by using a rectangular beam and a focus difference in the directions of 45° and 135° by using triangle beams having oblique sides in the directions of 45° and 135°, the focus differences being differences between just focus values in the two directions, and setting current values for the astigmatism correction coils so that the focus differences in the two directions are zero.

The step of setting the current values in the astigmatism correction coils comprises the substeps of sequentially changing the current values of the astigmatism correction coils to obtain the focus differences for a plurality of current values for the astigmatism correction coils, representing each relationship of the focus differences by a linear function to obtain current values to be set in the astigmatism correction coils from a cross point between the linear functions, and setting the obtained current values in the astigmatism correction coils.

The step of setting the current values of the astigmatism correction coils may further include the substeps of shifting the focus by a predetermined value after the step of adjusting the focus, obtaining the edge resolutions in two orthogonal directions subjected to astigmatism correction while the current values of the astigmatism correction coils are changed, and obtaining a corrected value of astigmatism when the edge resolutions in the two directions coincide with each other.

According to another aspect, the step of setting the current values of the astigmatism correction coils may include the substeps of shifting the focus by the predetermined value after the step of adjusting the focus, obtaining accumulated summation values in the two orthogonal directions subjected to astigmatism correction while the current values of the astigmatism correction coils are changed, and obtaining a corrected value of astigmatism when the accumulated summation values in the two directions coincide with each other.

The step of obtaining the accumulated summation values comprises the substeps of scanning the mark on the target with the charged beam while the current flowing through the astigmatism correction coils is changed, detecting back-scattered or secondary electrons back-scattered by the mark and generating a detection signal, and calculating a difference signal (differential) between wave data obtained by A/D-converting the detection signal and data obtained by delaying the wave data, and accumulatively summing difference signal data of not less than a predetermined threshold level.

Another method of correcting astigmatism of a variable shaped beam according to the present invention uses a charged beam lithographic apparatus having a deflector, arranged between first and second apertures, for variably controlling the size and shape of a charged beam to generate the shaped beam, a focus correction coil, arranged near an objective lens, for adjusting a focus of the shaped beam, and astigmatism correction coils, arranged near the objective lens, for correcting astigmatism of the shaped beam, and the method comprises the steps of:

adjusting a focus of the shaped beam by using the focus correction coil; and correcting the astigmatism of the shaped beam by using the astigmatism correction coils, the step of correcting the astigmatism of the shaped beam including the substeps of generating a rectangular beam having adjacent sides in directions of 0° and 90° and measuring first edge resolutions of the rectangular beam on a target, correcting astigmatism in the directions of 0° and 90° on the basis of the first edge resolutions, generating a triangle beam having an oblique side in a direction of 45° or 135° and measuring a second edge resolution of the triangle beam on the target, and correcting astigmatism in the directions of 45° and 135° on the basis of the second edge resolution.

In this method, the step of adjusting the focus comprises the substeps of scanning a mark formed on the target with a charged beam while a current flowing through the focus correction coil is changed, detecting back-scattered or secondary electrons back-scattered by the mark and generating a detection signal, and accumulatively summing wave data obtained by A/D-converting the detection signal, which is not less than a predetermined threshold level, and obtaining as a just focus value a current which maximizes the accumulated summation value.

The threshold level is an average value between maximum and minimum values of the wave data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a graph showing changes in just focus values as a function of the corrected values of astigmatism;

FIG. 8 is a view showing a beam scanning direction for measuring beam edge resolutions in the 45° and 135° directions;

FIG. 16 is a flow chart of the third embodiment;

FIG. 19 is a flow chart of the fourth embodiment; and

FIG. 20 is a flow chart of focus adjustment in the fourth embodiment.

DETAILED DESCRIPTION OF THE PREFERRED EMBODIMENTS

A method of correcting astigmatism of a variable shaped beam according to the first embodiment of the present invention will be described with reference to FIGS. 1 to 8.

Figure 1:
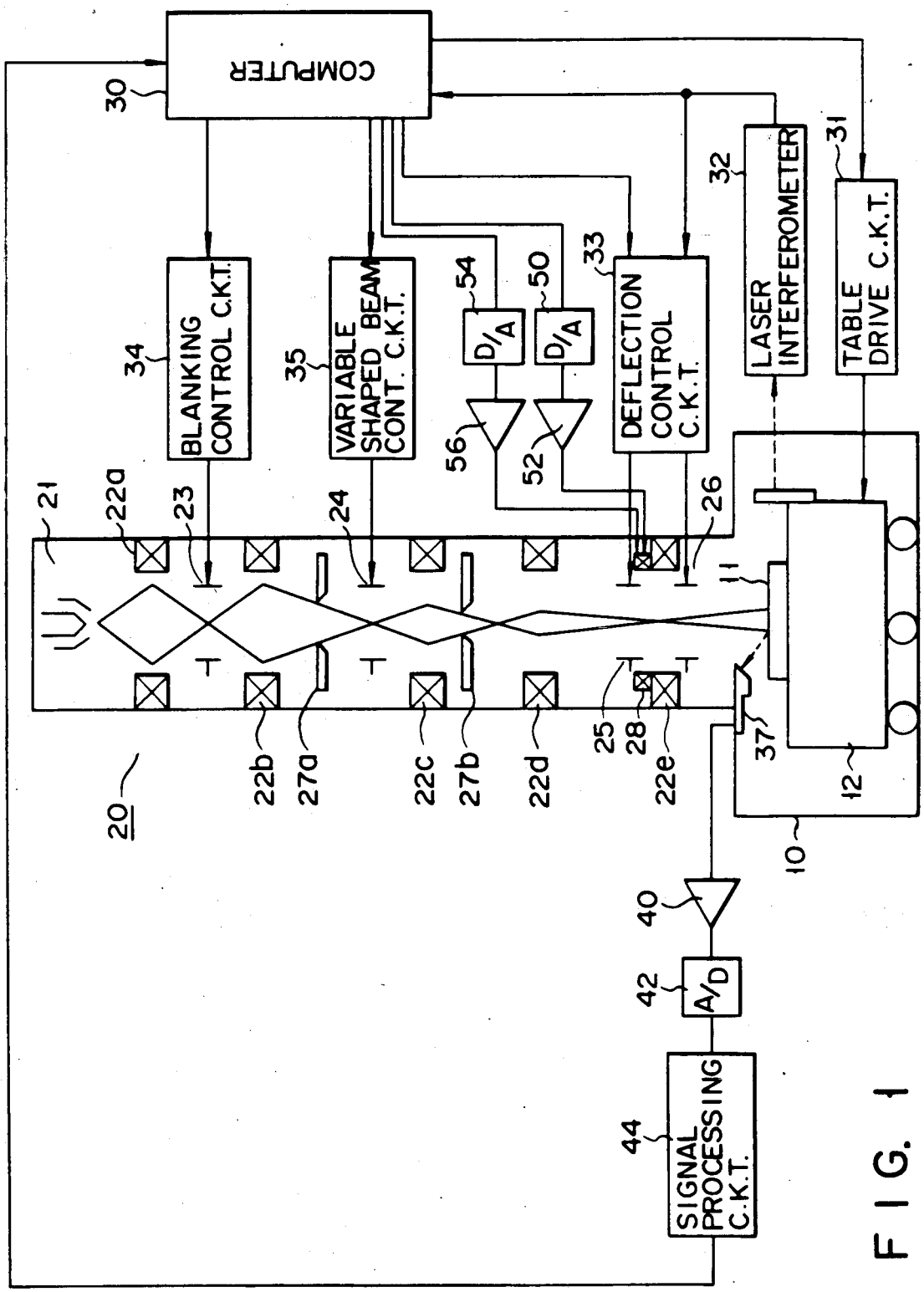
FIG. 1 is a schematic view showing an electron beam lithographic apparatus used in the first embodiment of the present invention.

FIG. 1 is a schematic view of an electron beam lithographic apparatus used in the first embodiment of the present invention. A target table 12 which supports a target 11 such as a semiconductor wafer is stored in a target chamber 10. The target table 12 can be moved in the X direction (right-and-left direction) and the Y direction (direction from the lower surface to the upper surface of the drawing sheet) by a table drive circuit 31 which receives a command from a computer 30. The displacement position of the target table 12 is measured by a laser interferometer system 32, and the measured data is transmitted to the computer 30 and a deflection control circuit 33.

An electron lens barrel 20 including an electron gun 21, lenses 22a, 22b, 22c, 22d, and 22e, deflectors 23, 24, 25, and 26, and beam shaping aperture masks 27a and 27b is arranged above the target chamber 10. The deflector 23 is a blanking deflecting plate for controlling an ON/OFF operation of the beam. A blanking signal is applied from a blanking control circuit 34 to the deflector 23. The deflector 24 is a variable beam size deflecting plate for variably controlling a beam size by utilizing overlapping of optical apertures of the aperture masks 27a and 27b. A deflecting signal is applied from a variable shaped beam control circuit 35 to the deflector 24. The deflectors 25 and 26 are beam scanning deflecting plates for scanning the beam on the target 11. Deflection signals are applied from the deflection control circuit 33 to the deflectors 25 and 26.

Astigmatism correction coils 28 (to be described later) and a focus correction coil (not shown) are arranged near the objective lens 22e. An astigmatism axial correction signal is input from the computer 30 to the astigmatism correction coils 28 through a D/A converter 50 and an amplifier 52. An astigmatism diagonal correction signal is input from the computer 30 to the astigmatism correction coils 28 through a D/A converter 54 and an amplifier 56. A focus correction signal is input from the computer 30 to the focus correction coil (not shown) through a D/A converter and an amplifier.

An electron detector 37 is arranged in the target chamber 10 to detect electrons and the like back-scattered by the target 11. The electron detector 37 is used to detect the back-scattered electrons and the like upon scanning of a positioning mark on the target 11 with an electron beam and to measure a mark position. A detection signal from the electron detector 37 is sent to the computer 30 through an amplifier 40, an A/D converter 42, and a signal processing circuit 44.

Figure 2:
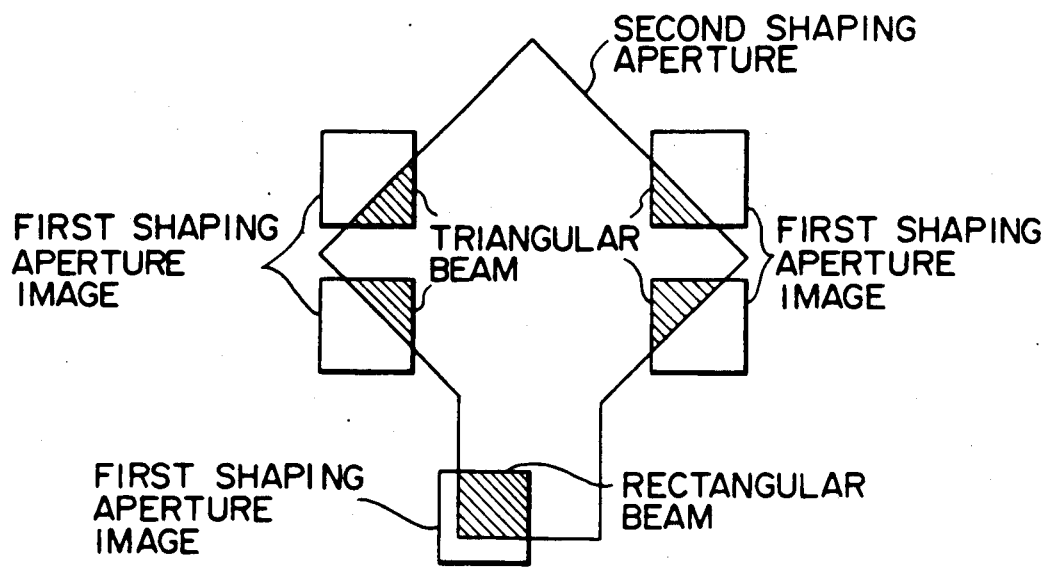
FIG. 2 is a view showing the shapes of apertures used in the apparatus shown in FIG. 1.
Figures 3A, 3B:
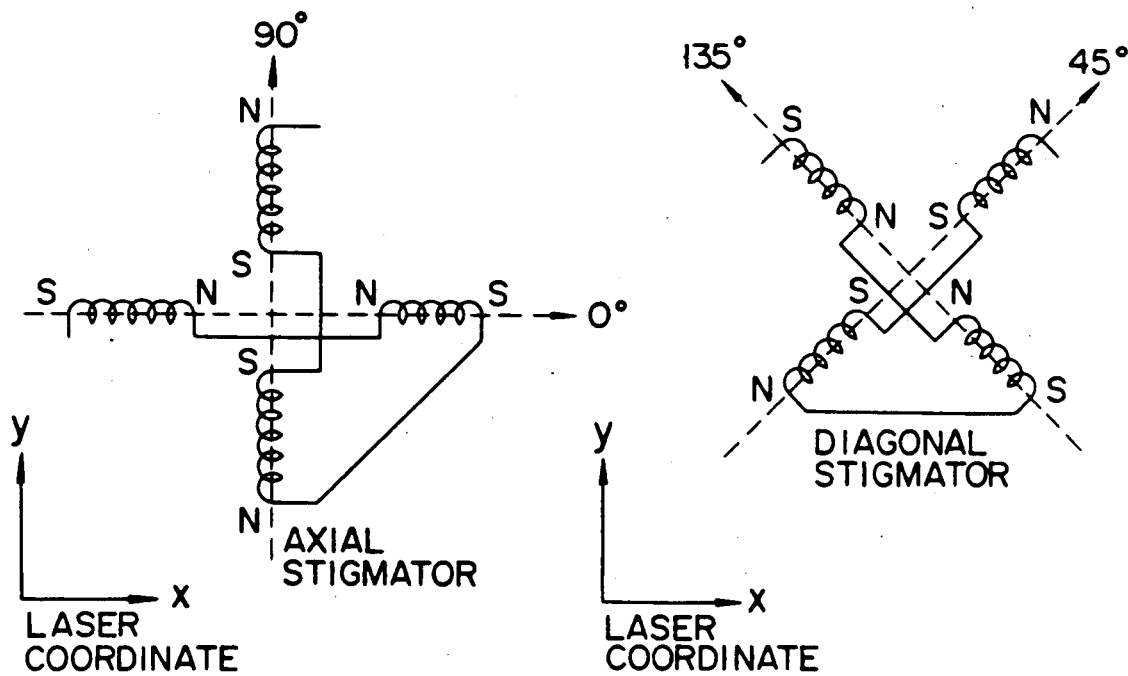
FIG. 3A is a view showing an astigmatism correction coil layout in the axial-direction (0°-90° direction) which is a direction along the axes of the laser coordinate system.
FIG. 3B is a view showing an astigmatism correction coil layout in the diagonal-direction (45°-135° direction) which is a diagonal direction against the axes of the laser coordinate system.

In the electron beam lithographic apparatus having the arrangement shown in FIG. 1, a method of performing astigmatism correction and focus adjustment will be described below. The electron beam lithographic apparatus can generate a rectangular beam and four triangle beams by using rectangular first shaping apertures and an arrow-like second shaping aperture, as shown in FIG. 2. The astigmatism correction coils 28 are arranged near the objective lens 22e and comprise an astigmatism correction coil for correcting astigmatism in the 0° and 90° directions (axial-direction) in the target coordinate system, as shown in FIG. 3A and an astigmatism correction coil for correcting astigmatism in the 45° and 135° directions (diagonal-direction), as shown in FIG. 3B. The astigmatism correction coils are interlocked to independently correct astigmatism in the axial- and diagonal-directions.

Figure 4A:
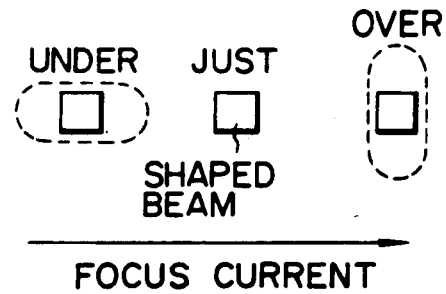
FIG. 4A is a view showing changed beam state caused by astigmatism in the axial-direction.
Figure 4B:
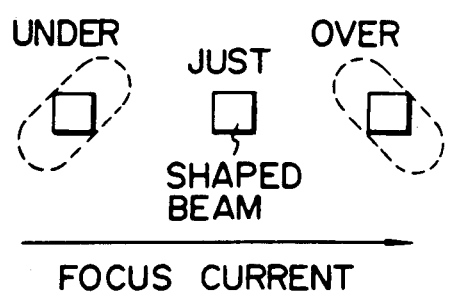
FIG. 4B is a view showing changed beam state caused by astigmatism in the diagonal-direction.

When a focus is changed in the presence of astigmatism of the rectangular beam in the axial- and diagonal-directions, intensity distributions of the rectangular beam are changed, as shown in FIGS. 4A and 4B. The astigmatism in the axial-direction can be corrected by measuring changes in edge resolution of the rectangular beam in the 0° and 90° directions. However, it is difficult to correct the astigmatism in the diagonal-direction by the above correction method. The astigmatism in the diagonal-direction can be corrected such that changes in beam edge resolution in the diagonal-direction are measured by using right-angled triangles having 45° and 135° oblique sides.

Figure 5:
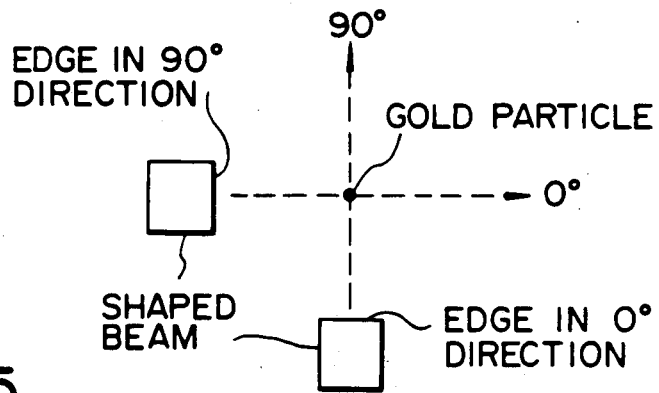
FIG. 5 is a view showing a beam scanning method for measuring beam edge resolutions in the 0° and 90° directions.
Figure 6:
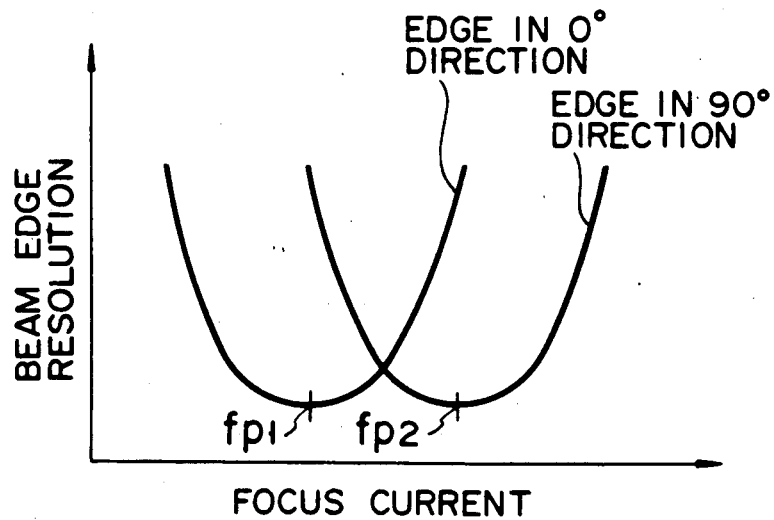
FIG. 6 is a graph showing changes in beam edge resolutions as a function of current values of the correction coil.

In this embodiment, focus adjustment and astigmatism correction are performed according to a gold particle method. The gold particle method is defined as a method of obtaining a beam intensity distribution from a back-scattered electron signal obtained upon scanning of a gold particle on a target with a shaped beam. First, focus adjustment is performed. The focus can be adjusted by measuring a beam resolution derived from the beam intensity distribution obtained according to the gold particle method. The beam resolution is defined as a distance corresponding to a change in peak value of the beam intensity distribution from 10% to 90%. The beam resolution is measured while the focus is changed, and the measured data are represented by a quadratic function. A peak value corresponding to a minimum beam resolution is a just focus value. For example, as shown in FIG. 5, the gold particle is scanned with the rectangular beam in the 0° and 90° directions. As shown in FIG. 6, beam edge resolutions in these directions are measured. Just focus values $f_{p1}$ and $f_{p2}$ in the 0° and 90° directions are obtained, and a value of $(f_{p1}+f_{p2})/2$ as a focus value is set in the focus correction coil. The just focus values $f_{p1}$ and $f_{p2}$ can be expressed as current values flowing through the focus correction coil. The above description is concerned with focus adjustment.

Astigmatism correction is then performed. A difference between the just focus values $f_{p1}$ and $f_{p2}$ is defined as a focus difference. If the focus difference is set to zero, the astigmatism is corrected.

Corrected values of astigmatism in the axial-direction are determined. A current value of the astigmatism correction coil is fixed to a predetermined value, while the current value of the focus correction coil is changed, thereby obtaining just focus values $f_{p1}$ and $f_{p2}$ in the 0° and 90° directions in the same manner as described above. The just focus values $f_{p1}$ and $f_{p2}$ can be expressed by current values of the focus correction coil. Another value is set in the astigmatism correction coil, and the same measurement as described above is performed to obtain just focus values $f_{p1}$ and $f_{p2}$. When this operation is repeated to obtain a relationship between the just focus values $f_{p1}$ and $f_{p2}$ and the corrected values of astigmatism, the result shown in FIG. 7 can be obtained. When the corrected values of astigmatism in the axial-direction are plotted along the abscissa, and the just focus values $f_{p1}$ and $f_{p2}$ (peak values) are plotted along the ordinate, two linear functions are obtained, as shown in FIG. 7. A corrected value of astigmatism is obtained by a cross point of these two linear functions and is set in the astigmatism correction coil, thereby correcting the astigmatism in the axial-direction.

Similarly, the right-angled triangle beams can be used to correct astigmatism in the diagonal-direction. As shown in FIG. 8, right-angled triangle beams 1 and 2 are generated to scan the gold particle on the target. More specifically, the gold particle is scanned with beam 1 in the 45° direction and beam 2 in the 135° direction. Resolutions of 135° and 45° edges of beams 1 and 2 are measured from the back-scattered electron signals from the gold particle. Just focus values in the 45° and 135° directions are obtained while the current values of the astigmatism correction coil in the diagonal-direction are changed, thereby obtaining a graph similar to that in FIG. 7. A focus difference is measured from this graph, and a corrected value of astigmatism which nullifies this focus difference is obtained. The astigmatism in the diagonal-direction is corrected by using this value.

Finally, the focus is finely adjusted to highly precisely perform focus adjustment and astigmatism correction of the shaped beam. As a result, forming precision of a drawing pattern can be greatly improved.

According to the first embodiment, the focus of the shaped beam can be corrected. At the same time, the astigmatism in the 45° and 135° directions in addition to the astigmatism in the 0° and 90° directions can be accurately corrected. In this embodiment, a rectangular beam having sides in the 0° and 90° directions and triangle beams having oblique sides extending in the 45° and 135° directions are used. However, it is essential to perform astigmatism correction in directions perpendicular to the sides of the shaped beam and direction oblique to the directions perpendicular to the sides.

A flow of a sequence of the first embodiment will be described with reference to flow charts in FIGS. 9 to 11.

Figure 9:
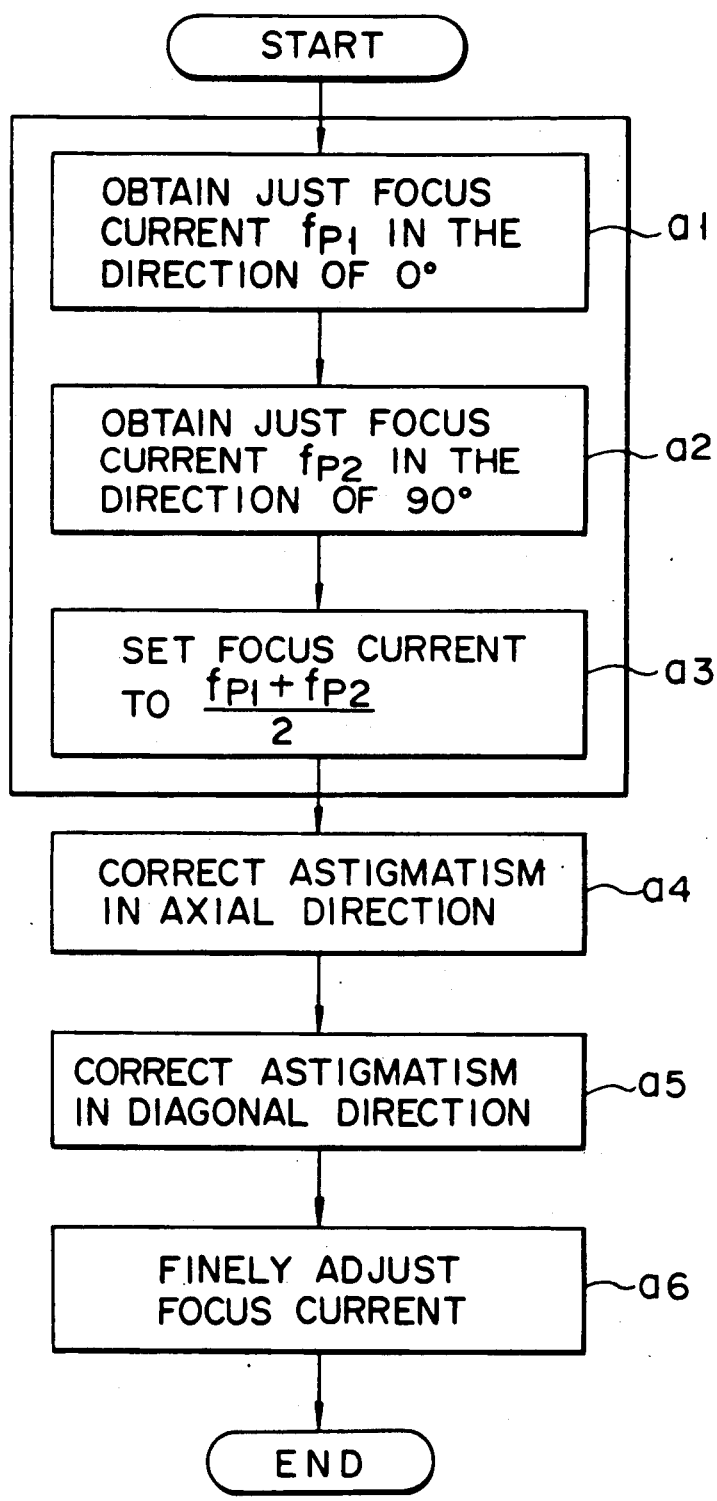
FIG. 9 is a flow chart showing the first embodiment.

Focusing is performed in step a1 to step a3 of FIG. 9. In step a1, a just focus current $f_{p1}$ in the 0° direction is obtained. In step a2, a just focus current $f_{p2}$ in the 90° direction is obtained. In step a3, a value $(f_{p1}+f_{p2})/2$ is obtained from the just focus current $f_{p1}$ and $f_{p2}$, and a current value of the focus correction coil is set in $(f_{p1}+f_{p2})/2$. In step a4, astigmatism in the axial-direction is corrected using a rectangular beam. In step a5, astigmatism in the diagonal-direction is performed using triangle beams. Finally, in step a6, the focus current is finely adjusted to complete focus adjustment.

The calculation for obtaining the just focus current $f_{p1}$ in the 0° direction in step a1 and the calculation for obtaining the just focus current $f_{p2}$ in the 90° direction in step a2 will be described in detail with reference to FIG. 10. In step b1, an initial focus current is set. In step b2, the gold particle is scanned with the shaped beam in a designated direction (0° or 90° direction). In step b3, a back-scattered electron signal from the gold particle is A/D-converted. In step b4, a beam resolution is obtained from the corresponding wave form data. In step b5, the focus current is increased. It is then determined in step b6 whether a measurement of a relationship between the focus current and the beam resolution is completed. If NO in step b6, the flow returns to step b2. The operations in step b2 to step b5 are repeated until the relationship between the focus current and the beam resolution is completely measured. When the measurement is completed, the relationship between the focus current and the beam resolution is represented by a quadratic function in step b7, and its peak value $(-b/2a)$ is set in the focus coil as the just focus current. Therefore, the just focus current $f_{p1}$ in the 0° direction and the just focus current $f_{p2}$ in the 90° direction can be obtained.

A method of correcting astigmatism in steps a4 and a5 in FIG. 9 will be described in detail with reference to FIG. 11. In step c1, an initial stigmator current is set. In step c2, a just focus current $f_{p1}$ in the 0° or 45° direction is obtained. In step c3, a just focus current $f_{p2}$ in the 90° or 135° direction is obtained. The order of operations in steps c2 and c3 may be reversed. In step c4, the stigmator current is increased. It is then determined in step c5 whether a measurement for obtaining a relationship between a corrected value of astigmatism and the just focus current is completed. If NO in step c5, the flow returns to step c2, and the operations in steps c2 to c4 are repeated. If YES in step c5, the flow advances to step c6 to represent the 0°- or 45°-direction measured data representing the relationship between the corrected value of astigmatism and the just focus current by a linear function. In step c7, the 90°- or 135°-direction measured data representing the relationship between the corrected value of astigmatism and the just focus current is represented by a linear function. The operations in steps c6 and c7 may be reversed. A just corrected value of astigmatism is obtained from a cross section of two lines and is set in the stigmator in step c8.

The second embodiment of the present invention will be described with reference to FIGS. 12A to 12C and FIG. 13. In this embodiment, equation (1) below is used in place of the beam resolution as a means for correcting a focus. By this method, the focus can be adjusted with higher precision at a higher speed.

Figure 12A:
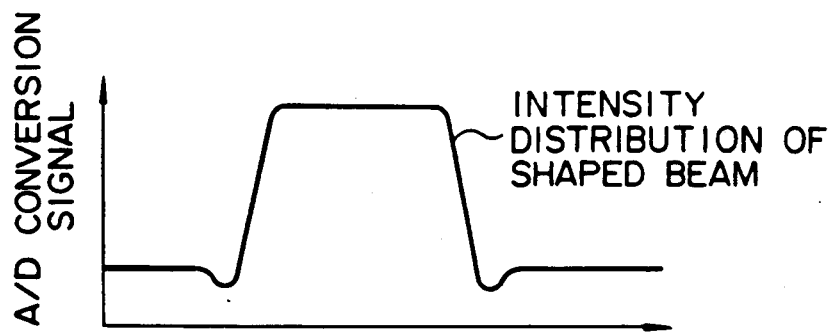
FIGS. 12A to 12C and FIG. 13 are views for explaining focus adjustment in the second embodiment.
Figure 12B:
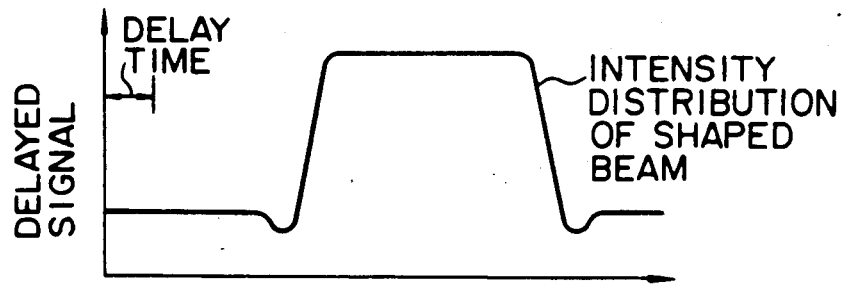
Figure 12C:
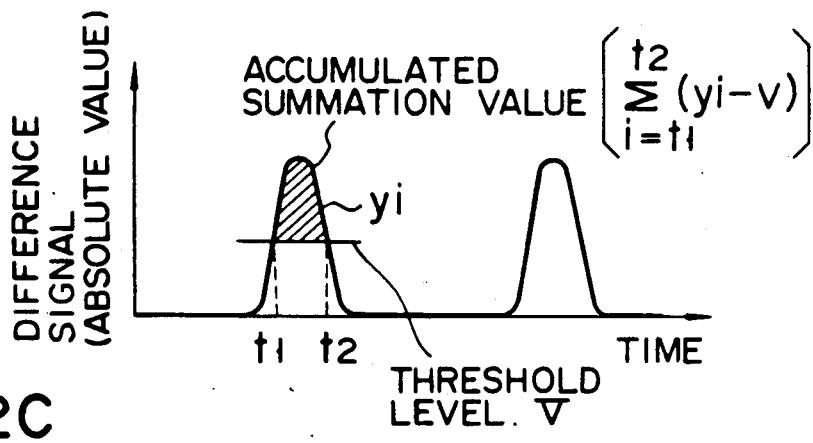

In place of the beam resolution used in the first embodiment, data obtained by A/D-converting the beam intensity distribution obtained according to the gold particle method and data obtained by delaying the A/D-converted data shown in FIG. 12B are used. A difference signal between these data is then obtained, as shown in FIG. 12C. An absolute value of the difference signal (differential) is obtained, and an accumulatively summed value or accumulated summation value of absolute values equal to or more than a threshold value as ½ of the beam intensity is calculated as follows:

$$\text{Accumulated Summation Value} = \sum_{i=t1}^{t2} (yi - v) \quad (1)$$

Figure 13:
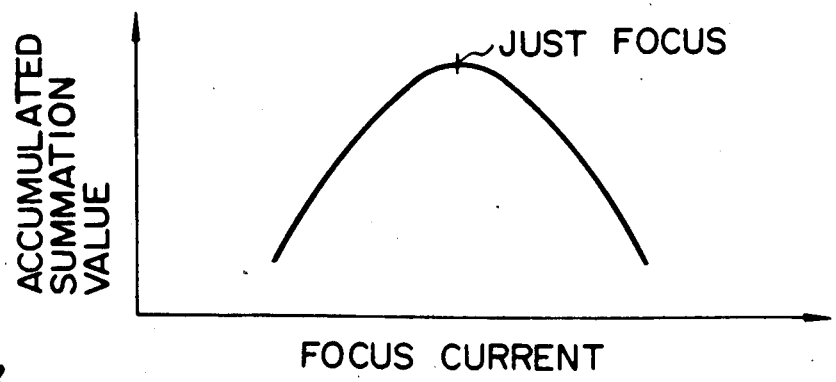

FIG. 13 shows a relationship between the accumulated summation value and the focus current. Judging from this relation, in order to perform a focusing operation, the maximum value of the accumulated summation value or a peak value $(-b/2a)$ obtained by substituting the relationship between these factors into a quadratic function $(Y = ax^2 + bx + c)$ is obtained. Either the maximum value or the peak value is defined as a just focus, thereby realizing a high-speed focusing method almost free from influences of noise.

Figure 10:
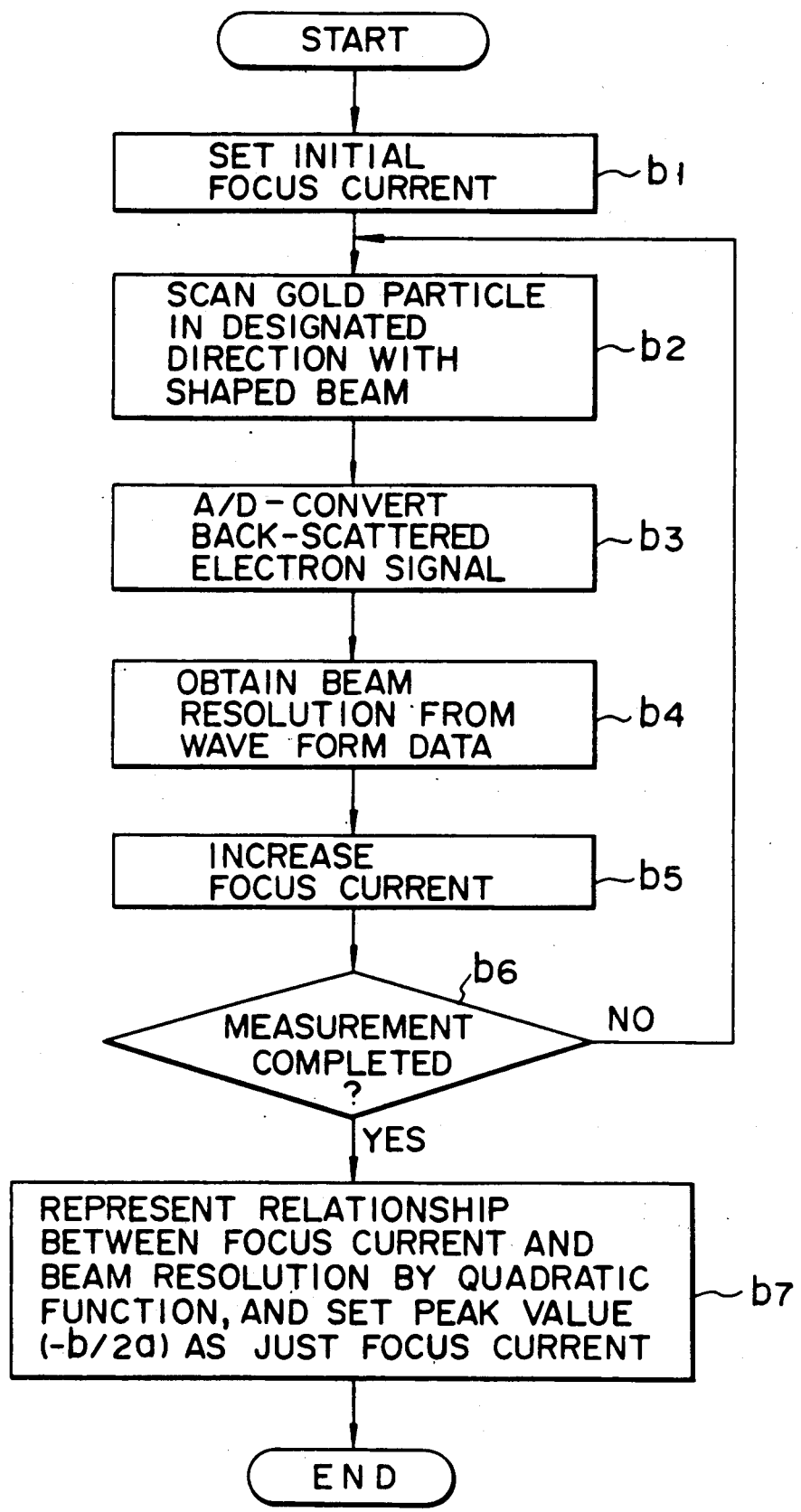
FIG. 10 is a flow chart of focus adjustment in the first embodiment.
Figure 11:
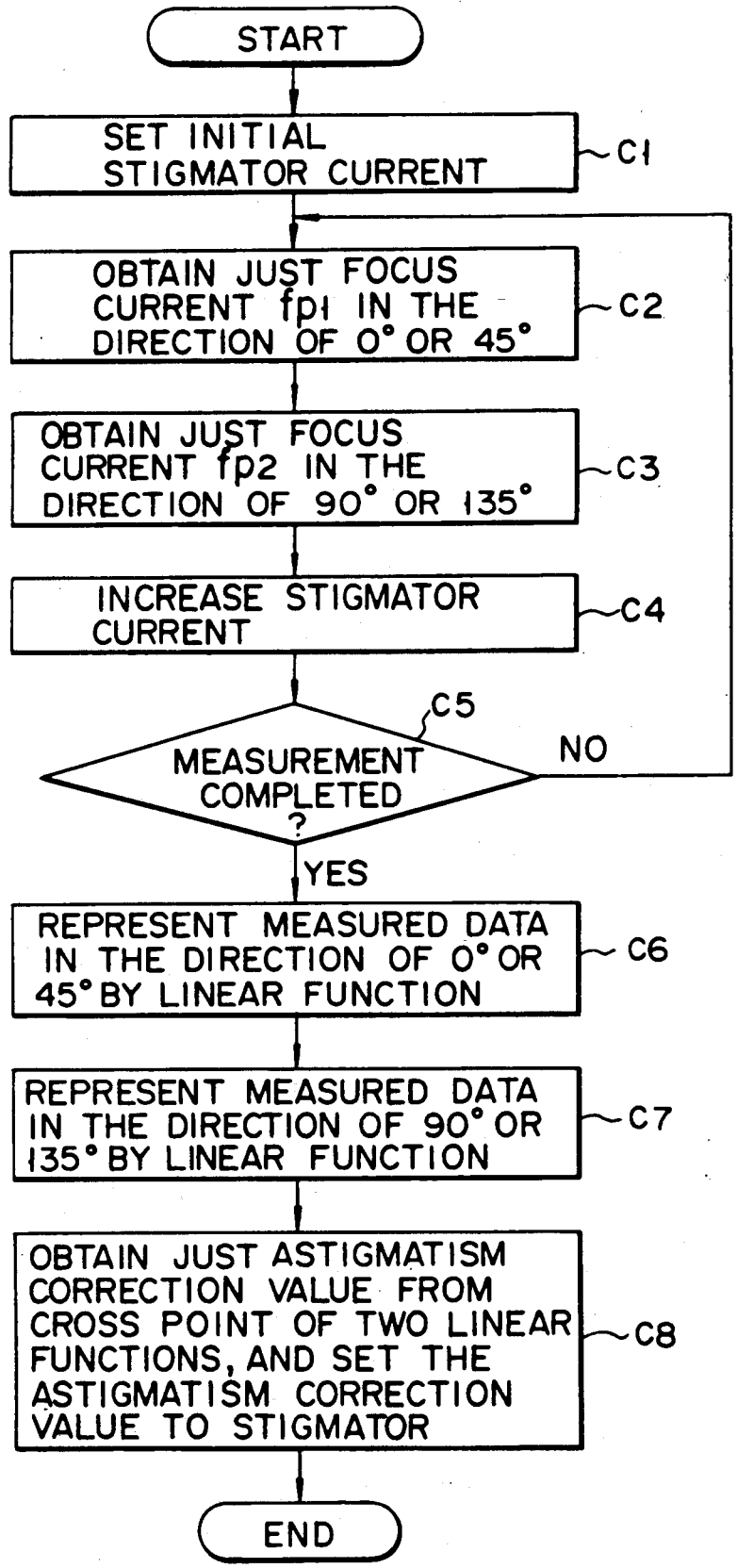
FIG. 11 is a flow chart showing astigmatism correction in the first embodiment.

The basic flow of the second embodiment is the same as that shown in FIG. 10. A method of correcting astigmatism in the second embodiment is the same as that in FIG. 11. A characteristic feature of the second embodiment is a technique for calculating just focus current $f_{p1}$ and $f_{p2}$, as will be described with reference to FIG. 14.

Figure 14:
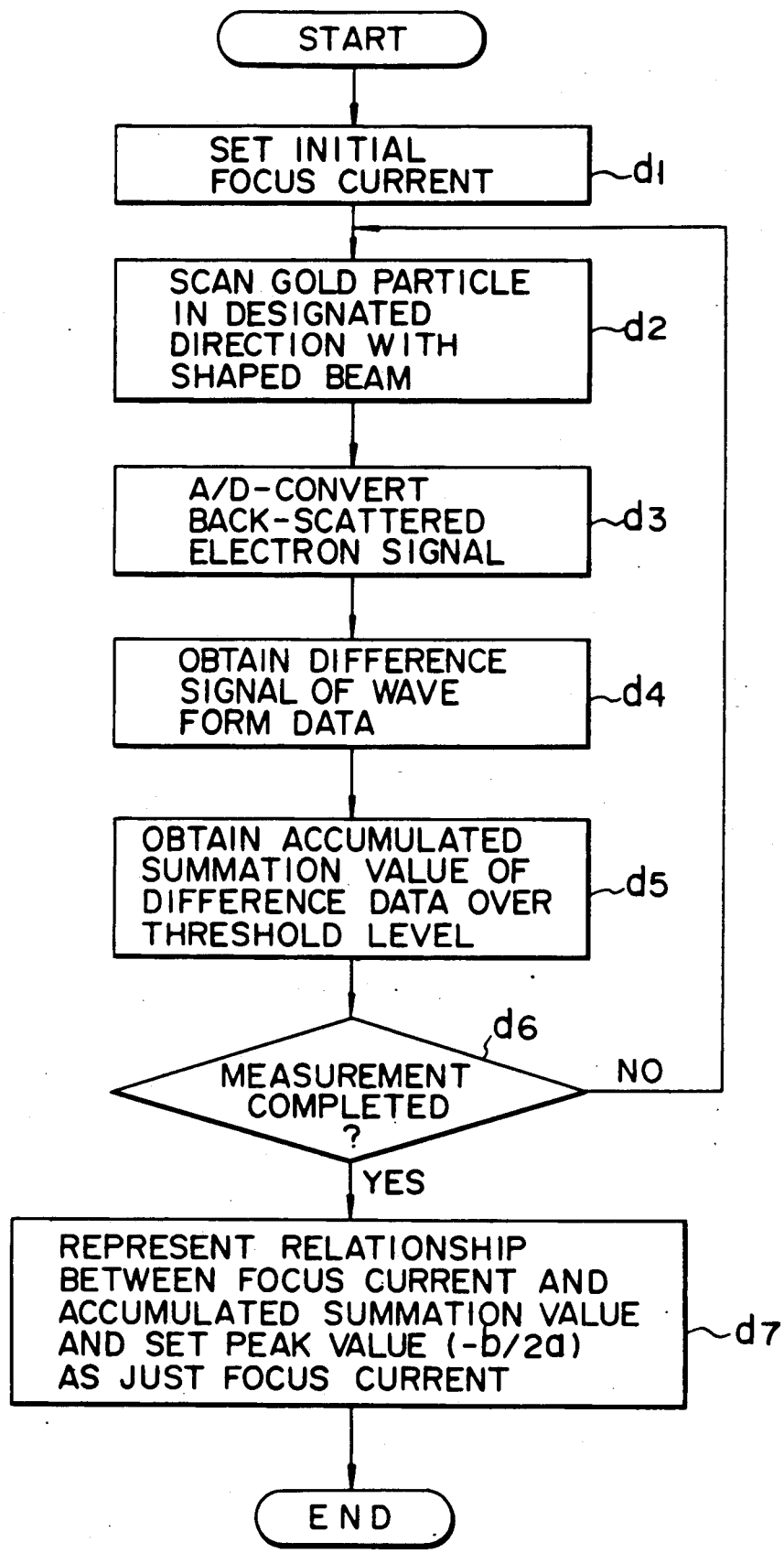
FIG. 14 is a flow chart showing focus adjustment in the second embodiment.

As shown in FIG. 14, an initial focus current is set in step d1. In step d2, the gold particle is scanned with a shaped beam in a designated direction (0° or 90° direction). An electron signal back-scattered by the gold particle is A/D-converted in step d3. In step d4, a wave form data signal is processed to obtain difference signal data, as shown in FIGS. 12A to 12C. In step d5, an accumulated summation value of the difference signal data equal to or more than a predetermined threshold level is obtained in step d5. When it is determined in step d6 that a measurement of the accumulated summation value of the difference signal data is not completed, the flow returns to step d2. Operations in steps d2 to d5 are continuously performed until the measurement is completed. If YES in step d6, the relationship between the focus current and the accumulated summation value is represented by a quadratic function, and the peak value $(-b/2a)$ is set as a just focus current.

Figure 15A:
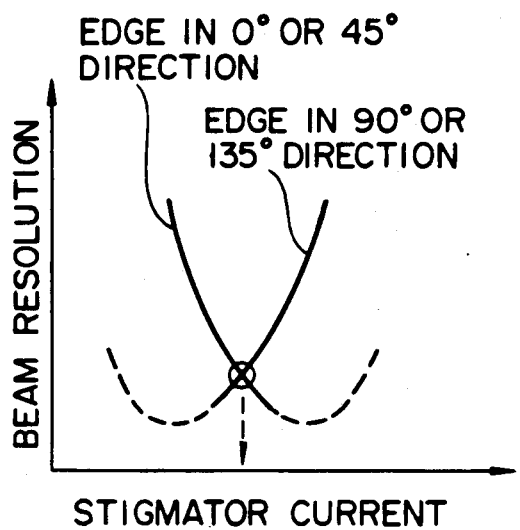
FIGS. 15A and 15B are views for explaining astigmatism correction in the third embodiment of the present invention.
Figure 15B:
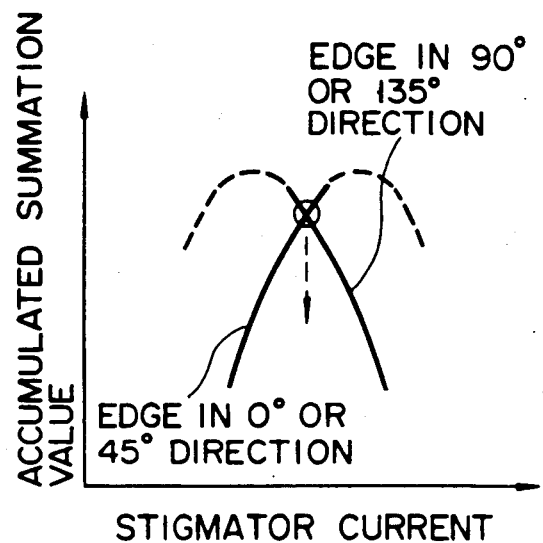

The third embodiment of the present invention will be described with reference to FIGS. 15A and 15B. This embodiment exemplifies the following astigmatism correction. Once focus adjustment is completed, a focus is shifted by a predetermined value. Edge resolutions of a beam in the 0° and 90° directions are obtained while the corrected value of astigmatism is changed, thus obtaining a relationship shown in FIG. 15A. An accumulated summation value of difference signal data is obtained in place of the beam edge resolution to obtain a relationship shown in FIG. 15B. Relationships between the stigmator current and the beam edge resolutions, or between the stigmator current and the accumulated summation value of the difference signal data are measured in two orthogonal directions, e.g., in the 0° and 90° directions. The relationships of the measured values are represented by two quadratic functions, and a just corrected value of astigmatism is obtained by a cross point of the two quadratic functions, i.e., a point at which the edge resolutions or the accumulated summation values of the difference signal data in the 0° and 90° directions coincide with each other. This method is applicable to astigmatism correction in the 45° and 135° directions by using triangle beams.

Figure 17:
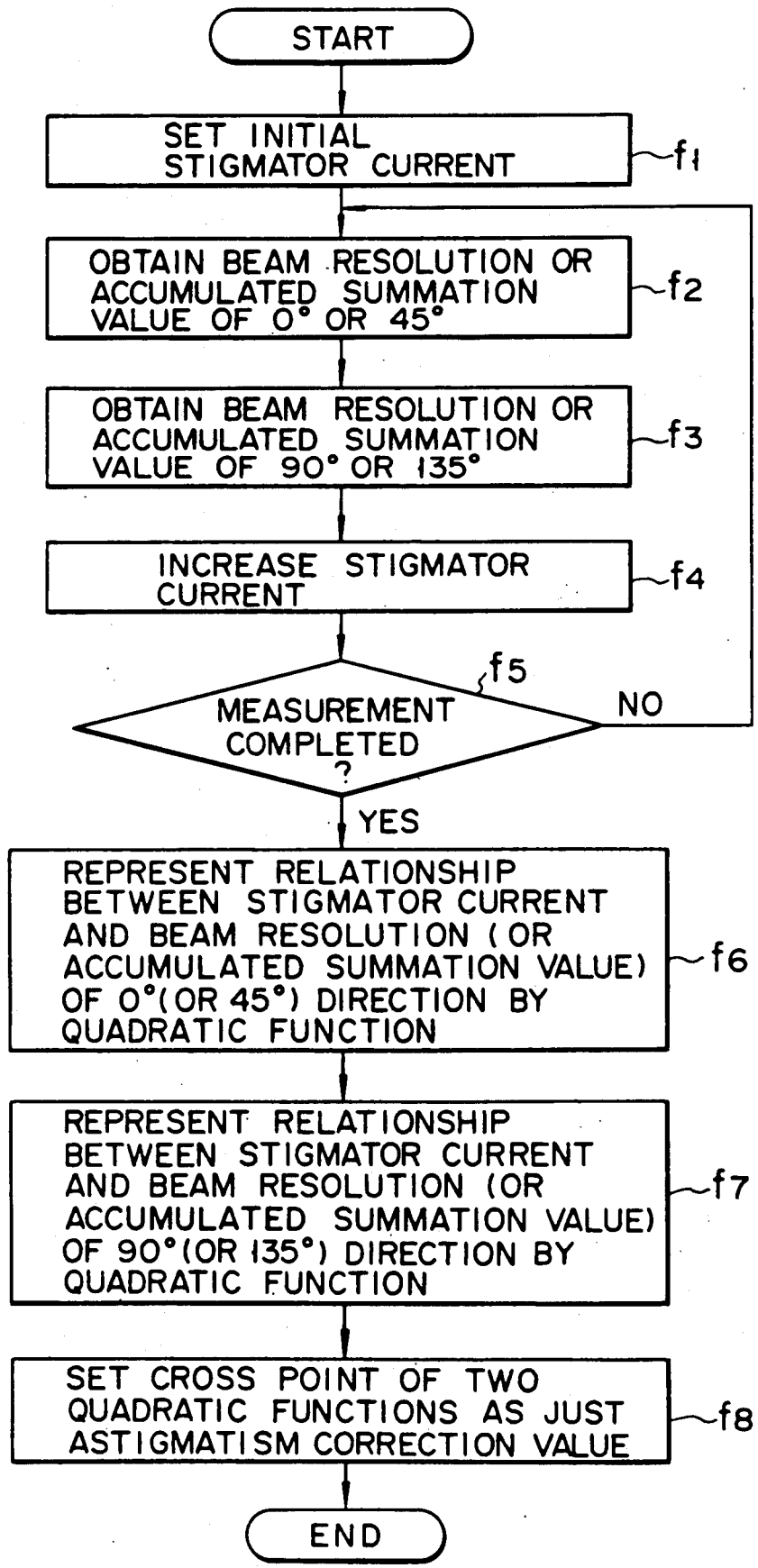
FIG. 17 is a flow chart showing astigmatism correction in the third embodiment.

A flow of this method will be described with reference to FIGS. 16 and 17. FIG. 16 shows a basic flow of the third embodiment. In step e1, the focus correction is performed. The focus is obscured by a predetermined value in step e2. In step e3, astigmatism of an axial-direction is corrected. In step e4, astigmatism of a diagonal-direction is corrected. The operations in steps e3 and e4 may be reversed. A focus current is reset to an initial value in step e5. In step e6, the focus current is finely adjusted. These are the operations in the basic flow.

A method of correcting astigmatism of the third embodiment will be described with reference to FIG. 17. In step f1, an initial stigmator current is set. In step f2, a beam resolution or an accumulated summation value in the 0° or 45° direction is obtained. In step f3, a beam resolution or an accumulated summation value in the 90° or 135° direction is obtained. The operations in steps f2 and f3 may be reversed. In step f4, the stigmator current is increased. When it is determined in step f5 that a measurement of the relationship between the stigmator current and the beam resolution or between the stigmator current and the accumulated summation value is not completed, the flow returns to step f2. The operations in steps f2 to f4 are repeated until the measurement is completed. If YES in step f5, the flow advances to step f6. In this step, the relationship between the stigmator current and the beam resolution obtained in the 0° or 45° direction or between the stigmator current and the accumulated summation value obtained in the 0° or 45° direction is represented by a quadratic function. In step f7, the relationship between the stigmator current and the beam resolution obtained in the 90° or 135° direction or between the stigmator current and the accumulated summation value obtained in the 90° or 135° direction is represented by a quadratic function. The operations in steps f6 and f7 may be reversed. A cross point of the two quadratic functions is set in the astigmatism correction coil as a just astigmatism.

The fourth embodiment of the present invention will be described with reference to FIGS. 18, 19, and 20.

This embodiment optimizes the focus adjustment and astigmatism correction sequence, thereby improving astigmatism correction.

Figure 18:
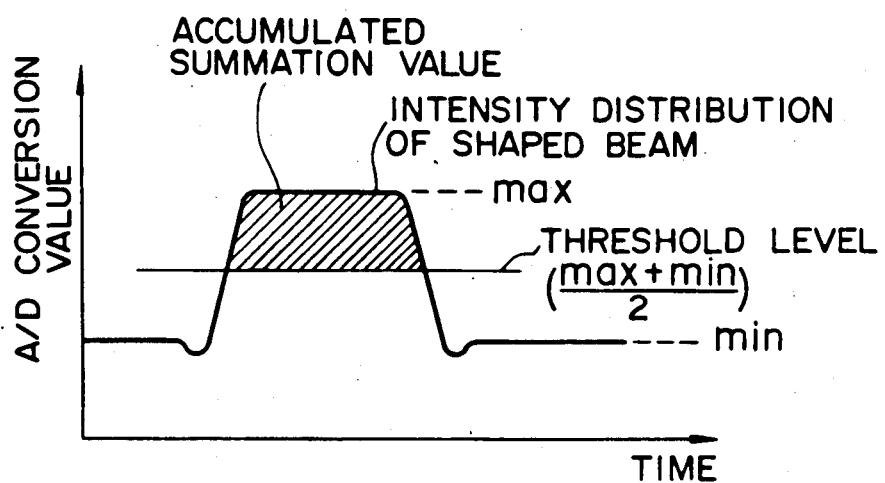
FIG. 18 is a view for explaining a focus adjustment in the fourth embodiment.

Wave form data shown in FIG. 18 is obtained by a rectangular beam. The wave form data are accumulatively summed with reference to a [(max+min)/2] threshold level. In the same manner as in FIG. 13, a peak value is obtained from a relationship between the focus and the accumulated summation value to coarsely adjust the focus. Thereafter, the focus is set at a position corresponding to $(f_{p1}+f_{p2})/2$ in accordance with the relationship between the focus and the accumulated summation value of the difference signals shown in FIGS. 12C and 13. Triangle beams are generated to correct astigmatism in the diagonal-direction, and then astigmatism in the axial-direction is corrected by the rectangular beam. Finally, a focus current corresponding to a zero focus difference obtained in astigmatism correction in the axial-direction is set in the focus coil.

When the astigmatism in the diagonal-direction is corrected and then the astigmatism in the axial-direction is corrected, influences of other correction coils are not imposed in the axial-direction (0°–90° direction). Therefore, astigmatism correction in the axial-direction can be highly precisely performed, and micropatterns in the 0° and 90° directions can be effectively formed.

A flow of the fourth embodiment will be described with reference to FIGS. 19 and 20. FIG. 19 shows a basic flow of the fourth embodiment. In step g1, a focus point is coarsely adjusted. In step g2, the focus is finely adjusted. In step g3, astigmatism in the diagonal-direction is corrected using triangle beams. In step g4, astigmatism in the axial-direction is corrected using a rectangular beam. The operations in steps g3 and g4 cannot be reversed. In step g5, a focus current corresponding to a zero focus difference obtained from the astigmatism correction in axial direction is set in the focus adjustment coil.

FIG. 20 is a flow of coarse focus adjustment of the fourth embodiment. In step h1, an initial focus current is set in the focus adjustment. In step h2, the gold particle is scanned with a shaped beam in a designated direction. A back-scattered electron signal from the gold particle upon its scanning is A/D-converted in step h3. In step h4, a {(MAX+MIN)/2{ threshold level is set from the wave form data. An accumulated summation value of the wave form data equal to or more than this threshold level is obtained in step h5. If it is determined in step h6 that the above measurement is not completed, the flow returns to step h2. A series of operations in steps h2 to h5 are repeated until the measurement is completed. If YES in step h6, the flow advances to step h7. A relationship between the focus current and the accumulated summation value is represented by a quadratic function. A peak value is defined as a just focus current which is then set in the focus coil. The above description is concerned with the processing flow of the fourth embodiment.

In the focus adjustment and astigmatism correction described above, when shaped beams (rectangular and triangle beams) having equal areas are used to scan the gold particle on the target, and the beam edge resolution or the accumulated summation value of the difference signals is obtained, high-speed processing can be performed due to the following reason. When astigmatic components in the respective directions are to be corrected, influences of halos of the beams by a spatial charge effect are identical. In addition, the gains and levels of the back-scattered electron detector amplifiers are equal to each other. Therefore, only one adjustment operation is required.

Each of the above embodiments exemplifies the electron beam lithographic apparatus. However, the present invention is also applicable to an ion beam lithographic apparatus. The arrangements of the optical systems and circuits are not limited to those in FIG. 1 and can be arbitrarily changed and modified in accordance with given technical specifications. However, in order to practice the method of the present invention, an arrangement must have a function of shaping a rectangular beam having adjacent sides extending in, e.g., 0° and 90° directions and beams (e.g., two triangle beams) having sides oblique to the sides of the rectangular beam, e.g., sides extending in the 45° and 135° directions, and astigmatism correction coils for correcting astigmatism in the 0° and 90° direction and astigmatism in the 45° and 135° directions.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of correcting astigmatism of a variable shaped beam, which uses a charged beam lithographic apparatus having first and second shaping apertures, a deflector for generating the shaped beam by an optical superposition, a focus correction coil for adjusting a focus of the shaped beam, and astigmatism correction coils for correcting the astigmatism of the shaped beam, the method comprising the steps of:
   adjusting the focus of the shaped beam by using said focus correction coil; and
   correcting the astigmatism of the shaped beam by using said astigmatism correction coils, the step of correcting the astigmatism of the shaped beam including the substeps of
   measuring first edge resolutions of the shaped beam in an arbitrary first direction and a second direction perpendicular to the first direction, and correcting first astigmatism in the first and second directions on the basis of the first edge resolutions, and
   measuring second edge resolutions in a third direction oblique to the first direction and a fourth direction perpendicular to the third direction, and correcting second astigmatism in the third and fourth directions on the basis of the second edge resolutions.

2. The method according to claim 1, further comprising the steps of:
   shifting the focus by a predetermined value after the step of adjusting the focus of the shaped beam;
   obtaining the edge resolutions in two orthogonal directions subjected to astigmatism correction while the current values of said astigmatism correction coils are changed; and
   obtaining a corrected value of astigmatism when the edge resolutions in the two directions coincide with each other.

3. The method according to claim 2, wherein the step of obtaining the corrected value of astigmatism comprises the substep of representing a relationship between the current values of said astigmatism correction coils and the edge resolutions by quadratic curves, and obtaining the corrected value of astigmatism from a cross point of the two curves.

4. The method according to claim 2, further comprising the steps of:
   shifting the focus by a predetermined value after the step of adjusting the focus of the shaped beam;
   obtaining the accumulated summation values in two orthogonal directions subjected to astigmatism correction while the current values of said astigmatism correction coils are changed, the step of obtaining the accumulated summation values in the two orthogonal directions including the substeps of
   scanning a mark on a target with the charged beam while currents flowing through said astigmatism correction coils are changed,
   detecting back-scattered or secondary electrons reflected by the mark and generating a detection signal, and
   calculating a difference signal (differential) between wave data obtained by A/D-converting the detection signal and data obtained by delaying the wave data, and accumulatively summing difference signal data of not less than a predetermined threshold level; and
   obtaining a corrected value of astigmatism when the accumulated summation values in the two directions coincide with each other.

5. The method according to claim 4, wherein the step of obtaining the corrected value of astigmatism comprises the substep of representing a relationship between the current values of said astigmatism correction coils and the accumulated summation values by quadratic curves, and obtaining the corrected value of astigmatism from a cross point of the two curves.

6. The method according to claim 5, wherein the step of obtaining the corrected value of astigmatism comprises the substep of representing a relationship between the current values of said astigmatism correction coils and the edge resolutions by quadratic curves, and obtaining the corrected value of astigmatism from a cross point of the two curves.

7. The method according to claim 1, wherein edge resolutions of shaped beams having equal areas are used to perform focus adjustment or astigmatism correction.

8. The method according to claim 1, wherein accumulated summation values of shaped beams having equal areas are used to adjust the focus, the accumulated summation values being obtained by the steps of
   scanning a mark on a target with the charged beam while currents flowing through said focus correction coils are changed,
   detecting reflected or secondary electrons reflected by the mark and generating a detection signal, and
   calculating a difference signal (differential) between wave data obtained by A/D-converting the detection signal and data obtained by delaying the wave data, and accumulatively summing difference signal data of not less than a predetermined threshold level.

9. The method according to claim 1, wherein accumulated summation values of shaped beams having equal areas are used to correct the astigmatism, the accumulated summation values being obtained by the steps of
   scanning a mark on a target with the charged beam while currents flowing through said astigmatism correction coils are changed,
   detecting reflected or secondary electrons reflected by the mark and generating a detection signal, and
   calculating a difference signal (differential) between wave data obtained by A/D-converting the detection signal and data obtained by delaying the wave data, and accumulatively summing difference signal data of not less than a predetermined threshold level.

10. A method of correcting astigmatism of a variable shaped beam, which uses a charged beam lithographic apparatus having first and second shaping apertures, a deflector for generating the shaped beam, a focus correction coil, arranged near an objective lens, for adjusting a focus of the shaped beam, and astigmatism correction coils, arranged near said objective lens, for correcting the astigmatism of the shaped beam,
   the method comprising the steps of:
   adjusting the focus of the shaped beam by using said focus correction coil; and
   correcting the astigmatism of the shaped beam by using said astigmatism correction coils, the step of correcting the astigmatism of the shaped beam including the substeps of
   generating a rectangular beam having sides in 0° and 90° directions to measure first edge resolutions of the rectangular beam on a target and a triangle beam having an oblique side extending in a 45° or 135° direction to measure second resolutions of the triangle beam on the target, and
   correcting the astigmatism in the 0° and 90° directions on the basis of the first edge resolutions and the astigmatism in the 45° and 135° directions on the basis of the second edge resolutions.

11. The method according to claim 10, wherein the step of adjusting the focus of the shaped beam includes the substep of scanning a mark on the target with the shaped beam, obtaining just focus values corresponding to minimum edge resolutions in two orthogonal directions while a current value of said focus correction coil is changed, and setting the just focus value in said focus correction coil; and
   the step of correcting astigmatism includes the substeps of
   calculating a focus difference in the directions of 0° and 90° by using a rectangular beam and a focus difference in the directions of 45° and 135° by using triangle beams having oblique sides in the directions of 45° and 135°, the focus differences being differences between just focus values in the two directions, and
   setting current values for said astigmatism correction coils so that the focus differences in the two directions are zero.

12. The method according to claim 11, wherein the step of setting the current values in said astigmatism correction coils comprises the substeps of:
   sequentially changing the current values of said astigmatism correction coils to calculate the focus difference between the plurality of current values of said astigmatism correction coils;
   representing each relationship of the focus differences by a linear function to obtain current values to be set in said astigmatism correction coils from a cross point between the linear functions; and
   setting the resultant current values in the astigmatism correction coils.

13. The method according to claim 10, wherein the step of adjusting the focus of the shaped beam comprises the substeps of:

scanning a mark on the target with the charged beam while a current flowing through said focus correction coil is changed;

detecting back-scattered or secondary electrons back-scattered by the mark and generating a detection signal; and calculating a difference signal (differential) between wave data obtained by A/D-converting the detection signal and data obtained by delaying the wave data, accumulatively summing difference signal data of not less than a predetermined threshold level, and obtaining as a just focus value a current which maximizes the accumulated summation value.

14. The method according to claim 10, further comprising the steps of:

shifting the focus by a predetermined value after the step of adjusting the focus of the shaped beam;

obtaining the edge resolutions in two orthogonal directions subjected to astigmatism correction while the current values of said astigmatism correction coils are changed; and obtaining a corrected value of astigmatism when the edge resolutions in the two directions coincide with each other.

15. The method according to claim 2, further comprising the steps of:

shifting the focus by a predetermined value after the step of adjusting the focus of the shaped beam;

obtaining the accumulated summation values in two orthogonal directions subjected to astigmatism correction while the current values of said astigmatism correction coils are changed, the step of obtaining the accumulated summation values in the two orthogonal directions including the substeps of scanning a mark on a target with the charged beam while currents flowing through said astigmatism correction coils are changed, detecting reflected or secondary electrons reflected by the mark and generating a detection signal, and calculating a difference signal (differential) between wave data obtained by A/D-converting the detection signal and data obtained by delaying the wave data, and accumulatively summing difference signal data of not less than a predetermined threshold level; and obtaining a corrected value of astigmatism when the accumulated summation values in the two directions coincide with each other.

16. The method according to claim 15, wherein the step of obtaining the corrected value of astigmatism comprises the substep of representing a relationship between the current values of said astigmatism correction coils and the accumulated summation values by quadratic curves, and obtaining the corrected value of astigmatism from a cross point of the two curves.

17. A method of correcting astigmatism of a variable shaped beam, which uses a charged beam lithographic apparatus having first and second shaping apertures, a deflector for generating the shaped beam, a focus correction coil for adjusting a focus of the shaped beam, and astigmatism correction coils for correcting the astigmatism of the shaped beam, the method comprising the steps of:

adjusting the focus of the shaped beam by using said focus correction coil; and correcting the astigmatism of the shaped beam by using said astigmatism correction coils, the step of correcting the astigmatism of the shaped beam including the substeps of generating a rectangular beam having sides extending in 0° and 90° directions to measure first edge resolutions of the rectangular beam on a target, correcting the astigmatism in the 0° and 90° directions on the basis of the first edge resolutions, generating a triangle beam having an oblique side extending in a 45° or 135° direction to measure second resolutions of the triangle beam on the target, and correcting the astigmatism in the 45° and 135° directions on the basis of the second edge, resolutions.

18. The method according to claim 17, wherein the step of adjusting the focus of the shaped beam comprises the substeps of:

scanning a mark on the target with the charged beam while a current flowing through said focus correction coil is changed;

detecting reflected or secondary electrons reflected by the mark and generating a detection signal; and accumulatively summing wave data obtained by A/D-converting the detection signal, which is not less than a predetermined threshold level, and obtaining as a just focus value a current which maximizes the accumulated summation value.

19. The method according to claim 18, wherein the threshold level is an average value of maximum and minimum values of the wave data.

* * * * *